United States Patent [19]
Calviello

[11] 4,312,112
[45] Jan. 26, 1982

[54] METHOD OF MAKING FIELD-EFFECT TRANSISTORS WITH MICRON AND SUBMICRON GATE LENGTHS

[75] Inventor: Joseph A. Calviello, Kings Park, N.Y.

[73] Assignee: Eaton Corporation, Cleveland, Ohio

[21] Appl. No.: 98,710

[22] Filed: Nov. 29, 1979

Related U.S. Application Data

[62] Division of Ser. No. 953,959, Oct. 23, 1978, abandoned.

[51] Int. Cl.³ .......................................... H01L 21/285
[52] U.S. Cl. ........................................ 29/571; 29/580; 357/15
[58] Field of Search ....................... 29/571, 580; 357/15

[56] References Cited

U.S. PATENT DOCUMENTS

| | | | |
|---|---|---|---|
| 3,717,563 | 2/1973 | Revitz et al. | 357/34 X |
| 3,923,975 | 12/1975 | Calviello | 29/580 |
| 3,943,622 | 3/1976 | Kim et al. | 29/571 X |
| 4,075,650 | 2/1978 | Calviello | 357/15 |

*Primary Examiner*—G. Ozaki
*Attorney, Agent, or Firm*—Kevin Redmond

[57] ABSTRACT

Field-effect transistors using Schottky junctions formed of tantalum on N-doped gallium arsenide with tantalum oxide and native oxide passivations.

3 Claims, 38 Drawing Figures

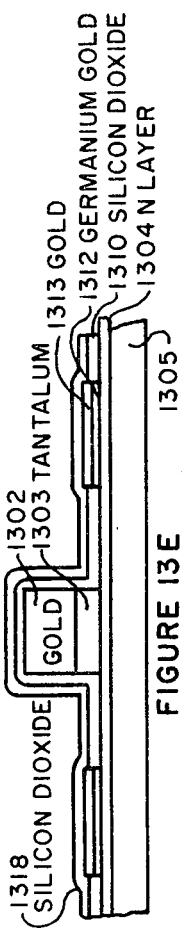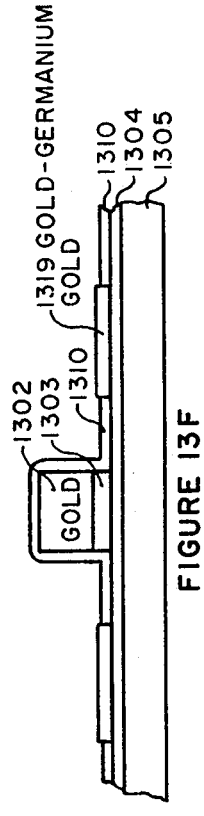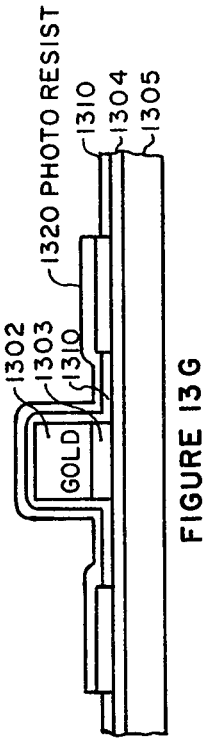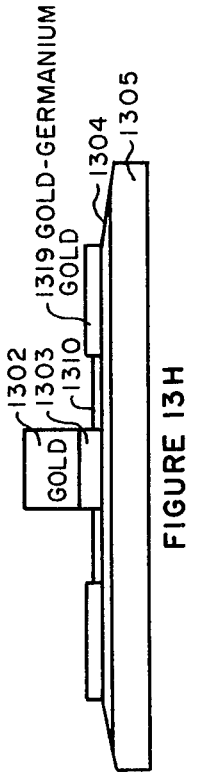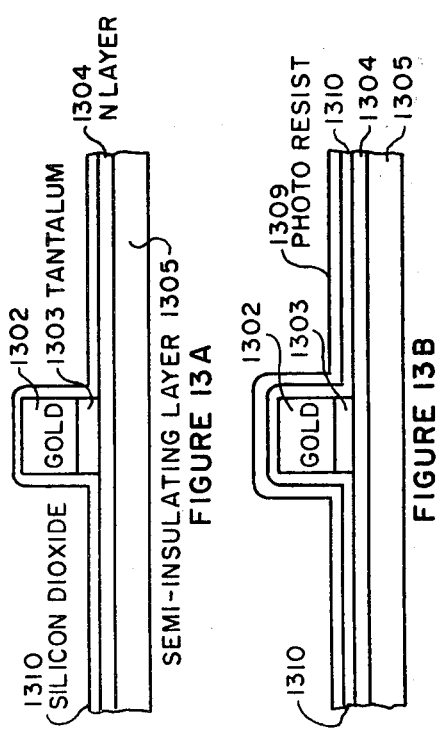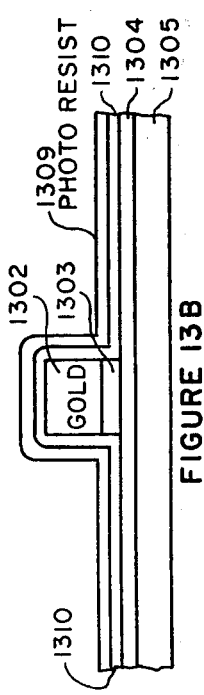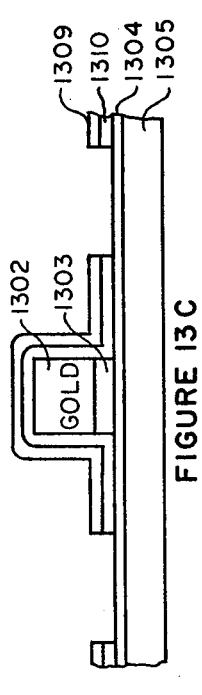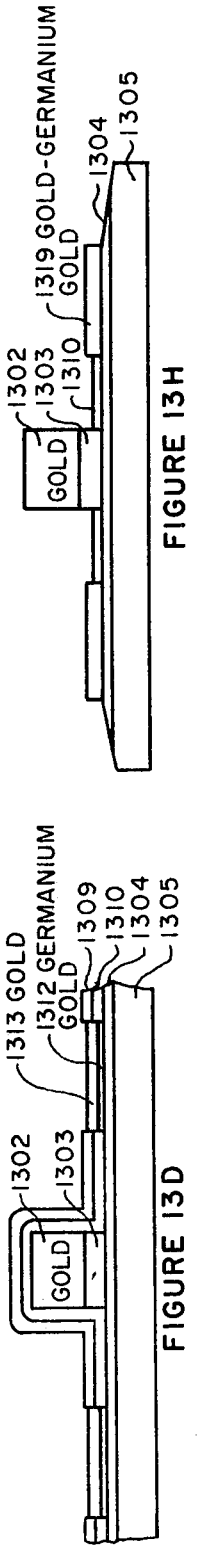

METHOD OF MAKING FIELD-EFFECT TRANSISTORS WITH MICRON AND SUBMICRON GATE LENGTHS

This is a division of application Ser. No. 953,959, filed Oct. 23, 1978, now abandoned and is related to copending application Ser. No. 098,802 and abandoned applications Ser. Nos. 953,926, 953,957, 953,958, 953,959 and 098,801.

BACKGROUND

1. Field

This invention relates to the production of semiconductor devices, and, in particular, to field-effect transistors intended for operation at microwave frequencies.

2. Prior Art

Typically, prior art field-effect transistors, commonly referred to as FETs, use aluminum as the contacting metal in the gate. Aluminum, however, is susceptible to electromigration and conversion to aluminum oxide, which increases the gate resistance and degrades RF performance.

The field-effect transistor gate also has been made of chromium, but chromium requires a diffusion barrier between the chromium and the usual gold overlayer, which adds to the cost of production.

To extend the operating frequency of a field-effect transistor into the microwave and near-millimeter-frequency ranges, it is necessary to reduce the gate length to a submicron dimension. Prior art techniques have been able to achieve gate length of the order of 0.2 micron, but in producing a gate of this length, the gate resistance has increased substantially, adversely affecting gain and noise figure.

Prior art passivation has often consisted merely of depositing a layer of silicon dioxide, despite the fact that silicon dioxide has proven not to be an effective passivation against sodium ions. In fact, silicon dioxide, when not properly processed, can act as a getter for sodium ions, resulting in degraded RF performance and reliability.

In current FET fabrication, formation of a mesa structure is one of the early steps, and this places the gate pad at a lower level than the gate, requiring the conductor from the gate pad to the gate to pass over the edge of the mesa. During the deposition process used to form the conductor, less conductor material deposits at the edge of the mesa than on the rest of the conductor path, creating a thinner, high-resistance portion at the bend in the conductor which degrades the RF performance and makes the transistor subject to burnout.

Formation of the mesa in the early steps of prior art processes has also resulted in later contamination of the mesa edge by residues left by the various subsequent metalization steps. These residues can enhance the transport mechanisms of other materials, such as gold, resulting either in a short or in degraded performance of the transistor.

Up to the present time, it has been difficult to make metaloxide semiconductor FETs, commonly referred to as MOS FETs, of gallium arsenide because of the high surface-state density at the oxide-semiconductor interface.

MOS FETs generally offer several advantages, including low leakage, the possibility of higher carrier concentration, and superior RF performance, making the successful production of a gallium arsenide MOS FET a worthwhile, but previously unattainable goal.

Prior art methods of producing MOS FETs have suffered from a number of difficulties. Most of the currently produced MOS FETs have an ohmic contact for the drain, and the ohmic contact often has an irregular diffusion profile that can result in unreliable performance and a reduction in the ability to handle high current.

In forming ohmic contacts, nickel has been widely used as a wetting agent for germanium gold and gold, to enhance the adherence of the germanium gold to the gallium arsenide, as well as to reduce clumping. However, it has been found that the nickel also causes metal segregation.

In attempts to use nickel with gallium arsenide, an additional difficulty has been encountered: the nickel reacts with the gallium arsenide, often causing the gallium arsenide to dissociate. The result is the production of a high resistivity layer at the points of dissociation.

SUMMARY

An object of the present invention is to provide a method for fabricating a field-effect transistor with a gate having an extremely short length and low resistance, comprising a thin tantalum contacting layer covered by a substantially thicker overlay of gold.

An object of the invention is to reduce the probability of burnout and to reduce the resistance in the gate pad conductor at the mesa edge, or at the rise over the N-layer, by widening the conductor at these places.

An object of the invention is to avoid contamination of the mesa edge of the field-effect transistor, by forming the mesa as one of the later steps in the fabrication process.

An object of the invention is to avoid contamination of the semiconductor surface, occurring after the removal of the first metalization, by converting the metalization away from the junction area into a passivated surface.

An object of the invention is to produce a metal oxide semiconductor junction with improved RF performance, reliability, and lower cost by using tantalum oxide for the junction as well as for passivation of areas away from the junction.

An object of the invention is to produce a MOS FET fabrication process that can be carried out at a relatively low temperature to improve reliability and to lower cost.

An object of the invention is to provide a new field-effect transistor configuration comprising an ohmic source, a Schottky barrier gate, and a Schottky barrier drain, the configuration being referred to herein as Ohmic-Schottky-Schottky OSS.

An object of the invention is to provide a field-effect transistor which eliminates the formation of a Gunn-mode between the source and the drain, permits operation at high temperatures, and provides for high resolution of the drain periphery by use of the OSS configuration.

An object of the invention is to eliminate the use of nickel in forming ohmic contacts, by a process which includes an initial cleaning step applied prior to the deposition of germanium gold, and a step in which the deposition thicknesses of the germanium gold and the gold are controlled.

BRIEF DESCRIPTION OF THE DRAWINGS

FIG. 13 is a series of cross sectional views illustrating the process for producing a field-effect transistor without the use of nickel as a wetting agent.

DETAILED DESCRIPTION

Figure 1:
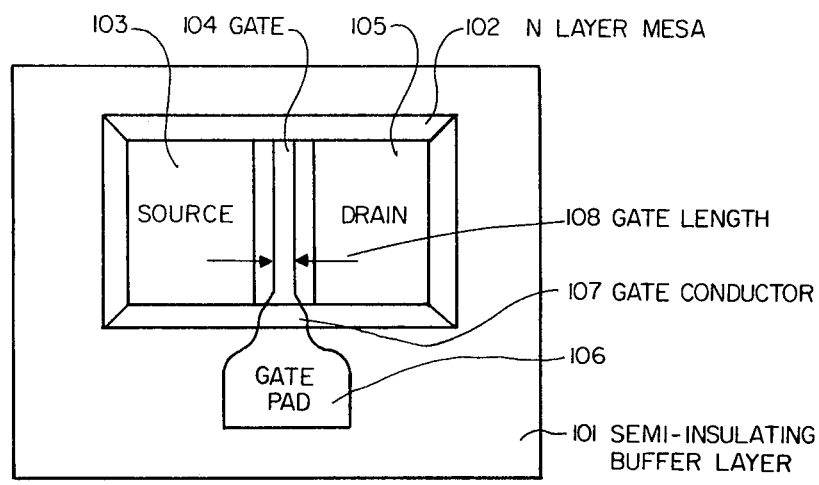
FIG. 1 is a plan view of a field-effect transistor.

FIG. 1 is a plan view of a common configuration of a field-effect transistor, comprising a source 103, a gate 104, a drain 105, an N-layer 102, a gate conductor 107, a gate pad 106, and a semi-insulating buffer layer 101.

Figure 2:
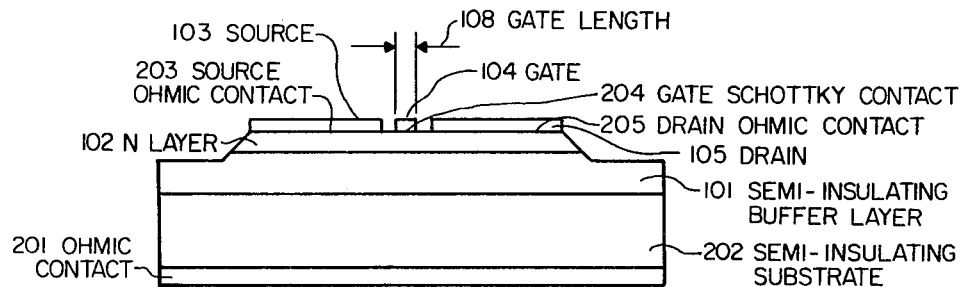
FIG. 2 is a cross sectional view of a field-effect transistor.

FIG. 2 is a cross sectional view of the field-effect transistor shown in FIG. 1, in which the source and the drain are shown making contact with the N-layer at surfaces 203 and 205, respectively. These are usually ohmic contacts, while the gate which makes contact with the N-layer at a surface 204 forms a Schottky barrier junction.

A semi-insulating substrate 202, located below the buffer layer, supports the entire transistor and includes an ohmic contact 201 on its lower surface for mounting purposes.

An alternate construction is possible in which the N-layer is located directly on the semi-insulating substrate rather than on a buffer layer. The epitaxially grown semi-insulating buffer layer, in some transistors, is an extension of the semi-insulating substrate. The buffer layer has fewer imperfections and impurities, thus making it possible to sequentially grow high quality N-layers. The buffer layer also prevents imperfections and impurities, usually present in the semi-insulating substrate, from reaching the active N-layer, thus increasing the reliability and performance of the device.

In the operation of a field-effect transistor, current, which usually flows from the source to the drain through the N-layer, is controlled by the potential applied to the gate. For high frequency operation, it is essential that the gate length be kept to a minimum. The gate length is identified in FIG. 1 by numeral 108.

Prior art methods of producing short gate lengths have usually resulted in relatively high gate resistances. The reason for this can be seen by considering the aluminum gate of FIG. 3, which was formed by prior art chemical etching. The chemical etching produced as much undesired etching on the side 303 as it did in the desired downward direction 304, which is necessary to form the gate. The result of the etching is a sloping side 302.

The lateral etching produces a gate with a truncated triangular cross section. A more desirable cross section is shown in FIG. 5.

Figure 5:
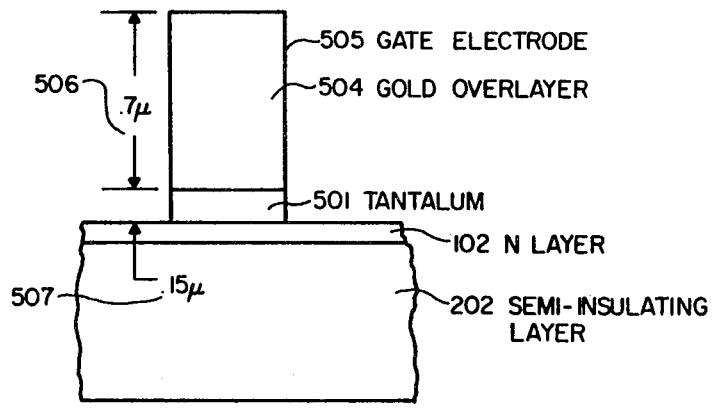
FIG. 5 is a cross sectional view of a sputter-etched gate.

The cross section of the gate electrode 505 shown in FIG. 5 is essentially rectangular, indicating that little or no lateral etching has taken place in forming this gate. The gate of FIG. 3 has substantially less gate conductor material than that of FIG. 5 and, consequently, has a higher resistance.

Figures 4A, 4B:
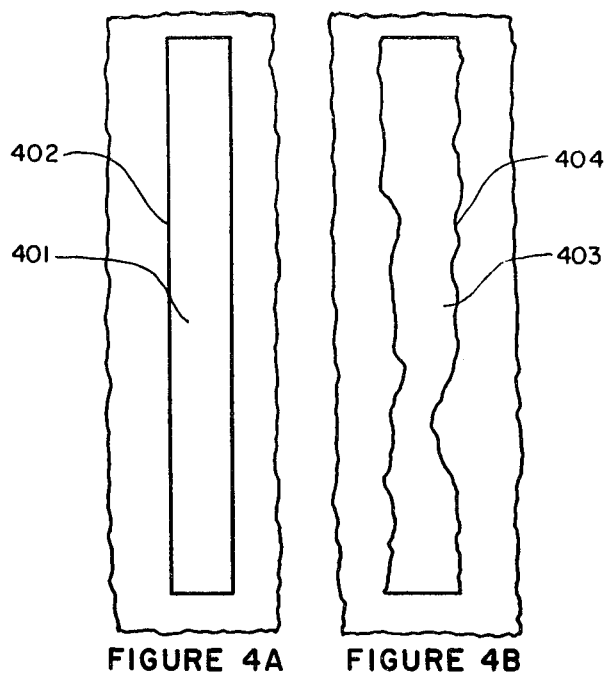
FIG. 4 is a plan view of a sputter-etched gate and a chemically etched gate.

Another problem encountered with prior art chemical etching is demonstrated by a comparison of the gates, shown in FIGS. 4A and 4B. FIG. 4A is a plan view of an ideal gate, while 4B is the plan view of a typical gate produced by chemical etching.

The ideal gate, identified by numeral 401, has a smooth periphery 402, while the prior art etched gate 403 has a jagged periphery 404. The jagged periphery of FIG. 4B is the result of the unequal etching rates occurring at various places along the gate, which increases the gate resistance and degrades RF performance.

The more ideal gate of FIG. 5 comprises a thin layer of tantalum 501 with a substantially thicker overlayer of gold 504. The tantalum thickness 507 is shown as being typically 0.15 micron while the gold thickness 506 is shown as being typically 0.7 micron or about five times the thickness of the tantalum. The tantalum thickness may range from 0.07 to 0.2 micron, while the gold may range from 0.5 to 1.5 micron.

Figure 3:
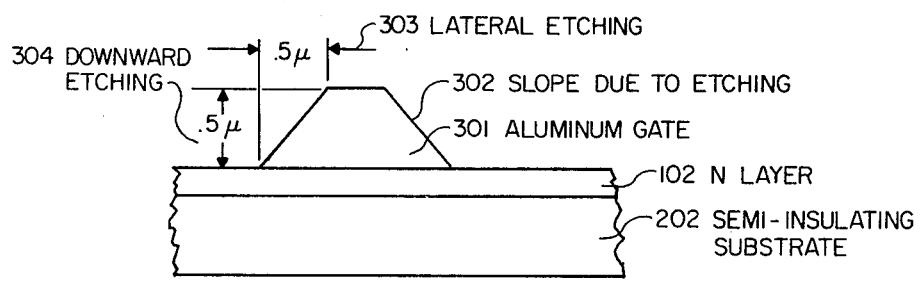
FIG. 3 is a cross sectional view of a gate produced by chemical etch.

This structure provides a much larger cross section than the aluminum gate 301 of FIG. 3 and, consequently, a much lower resistance. The truncated triangular cross section and the jagged periphery of prior art chemically etched gates have been eliminated in the device of FIG. 5 through the use of sputter etching, which will be described later.

Figure 6:
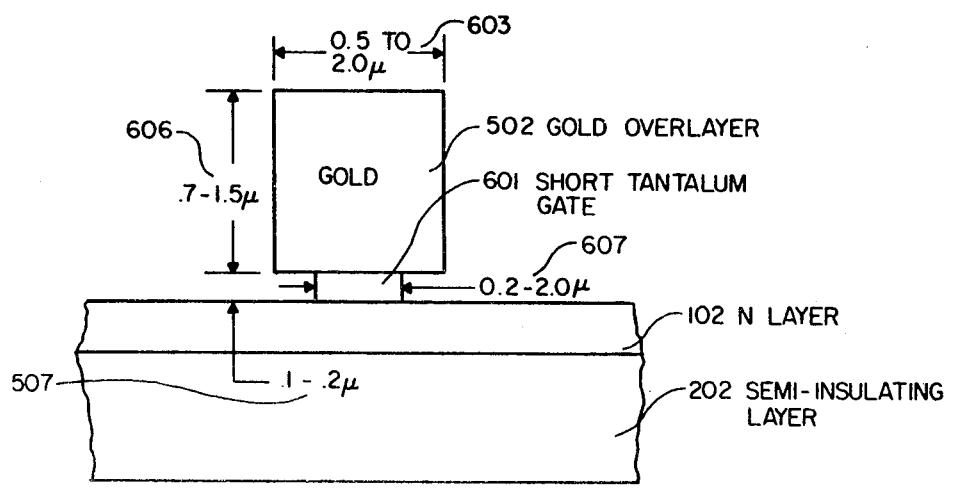
FIG. 6 is a cross sectional view of a sputter-etched gate with an undercut tantalum layer.

A further improvement in the gate is shown in FIG. 6. Here the tantalum gate 601 has been narrowed beneath the gold overlayer 502 to produce the short gate length necessary for high frequency applications, but with the same large cross section of gold overlayer necessary for a low gate resistance. It can be seen that the tantalum gate length 606 ranges from 0.2 to 2 microns, while the gold overlayer width 603 ranges from 0.5 to 2.0 microns, indicating that the undercut of tantalum under the gold overlayer can be as high as 50 percent.

Tantalum is used as the contacting material for the gate shown in FIGS. 5 and 6 because it not only makes an excellent Schottky barrier junction, but also provides a diffusion barrier for the gold overlayer. Tantalum is preferred, but other refractory metals, such as tungsten or molybdenum can also be used for the diffusion barrier.

Although gold forms a low-resistance, stable conductor, it cannot be used to form a satisfactory Schottky junction. Gold tends to migrate into the semiconductor material, destroying the junction, unless a satisfactory diffusion barrier, such as tantalum, is provided to isolate the gold from direct contact with the semiconductor material.

Until recently, it was generally believed that tantalum was an unsatisfactory material for forming a Schottky barrier junction or a diffusion barrier for gold, but through the use of high vacuum deposition techniques described in U.S. Pat. No. 3,886,580, tantalum has proven to be a superior material for these applications.

The high vacuum deposition technique mentioned above has been combined with sputter etching to successfully produce gates for field-effect transistors with extremely short lengths and low resistivity in the ideal configurations shown in FIGS. 4A, 5 and 6.

FIGS. 7A through E illustrate the steps in producing the gate of a field-effect transistor of the type shown in FIG. 6. The initial step, shown in FIG. 7A, consists of depositing on the upper surface of a body of gallium arsenide 704, successive layers of tantalum 703, gold 702, tantalum 701, and photo resist 705. The photo resist is exposed and etched to leave a protective coating over only the area in which the gate is to be formed. The depositions are actually thin layers, but they are shown thicker and out of scale for illustrative purposes.

The first tantalum deposition 701 and the gold deposition 702 are produced by a high vacuum electron beam technique in which the beam produces a temperature sufficient to melt the material. It is possible to use this technique for these two depositions, because the melting temperature of tantalum is approximately 2996 degrees centigrade, while that of gold is only 1063 degrees centigrade. The lower melting temperature of gold permits it to be deposited on the first tantalum layer 703.

The second layer of tantalum 701 cannot be deposited by the electron beam technique without melting the gold. This difficulty is overcome by changing the deposition process to RF sputtering.

Figure 7A:
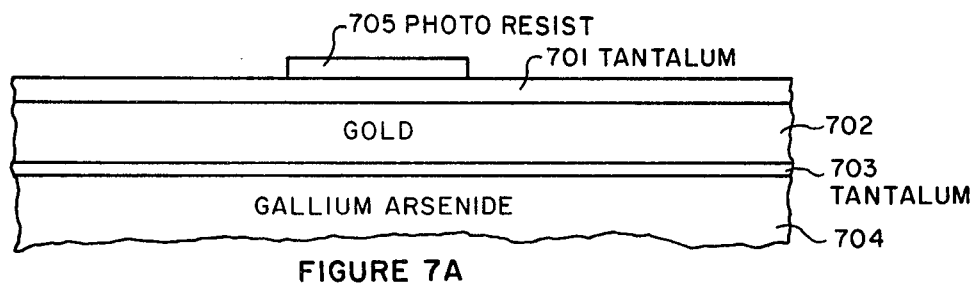
FIG. 7 is a series of cross sectional views showing the process for producing a sputter-etched gate with an undercut tantalum layer.
Figure 7B:
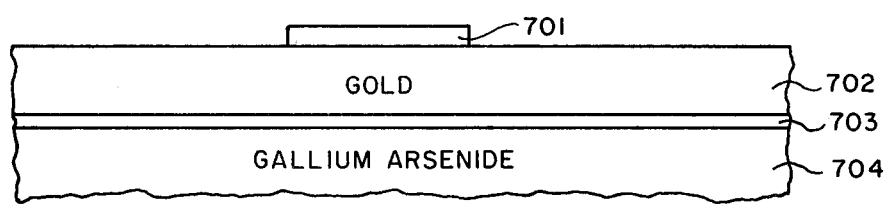

The results of the second step are shown in FIG. 7B. In this step, the tantalum layer 701 is removed by means of RF sputtering everywhere except over the gate area. The photo resist 705, which protected the tantalum over the gate area, is then removed by conventional means.

Figure 7C:
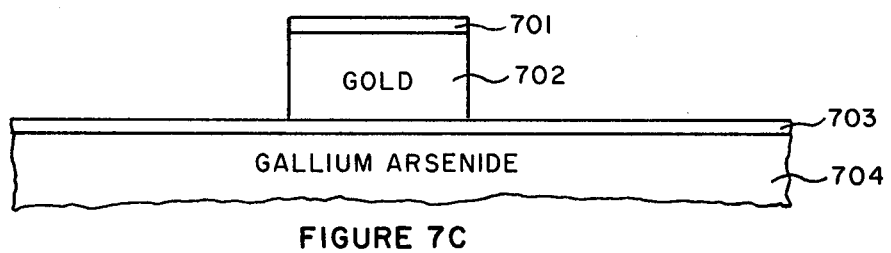

The results of the third step are shown in FIG. 7C. In this step, the gold is removed everywhere, except where protected by the remaining tantalum layer 701. The gold is removed by RF sputtering in an argon-oxygen atmosphere.

Figure 7D:
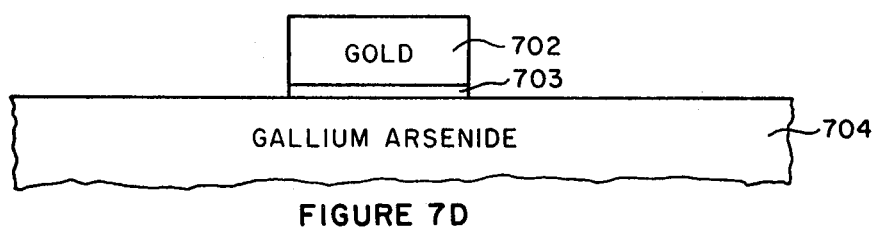

The results of the fourth step are shown in FIG. 7D. In this step, the remaining second layer 701 is completely removed, while the first tantalum layer 703 is removed entirely, except where protected by the remaining gold 702. Note that the remaining tantalum layer 701 and the tantalum layer 703 are removed simultaneously.

During this removal operation, the tantalum layer 701 protects the gold layer 702. The tantalum layers are removed by means of sputter etching in a carbon tetrafluoride-oxygen atmosphere at a pressure ranging from 50 to 500 microns of mercury. The RF power during this etching process is in the range of 70 to 100 watts over a six inch diameter electrode.

Figure 7E:
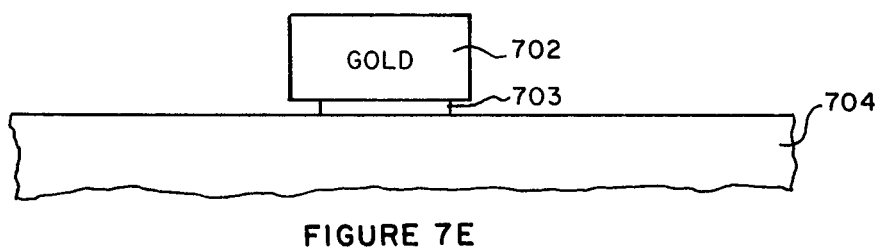

The above described last step in the gate forming process produced an undercut in the tantalum layer, located beneath the gold overlayer, to provide the short gate length, required for good performance at microwave frequencies. The gate length in FIG. 7E is the horizontal distance across the contacting layer 703. The longer length and appreciably greater thickness of the gold overlayer provides a larger cross section of low resistivity material to reduce the overall gate resistance.

Although the gold overlayer is as much as 50 percent longer than the tantalum, it is still much too small for attachment of a lead and requires the addition of a gate pad. The gate pad is usually a relatively large metalized area at one side of the gate. Connection between the gate and the gate pad is made by means of a metalized strip, herein called the gate conductor.

Figure 8A:
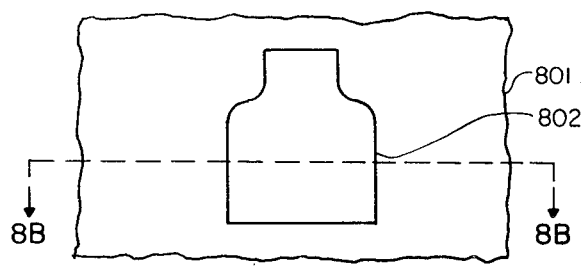
FIG. 8 is a plan view and a series of cross sectional views, showing the process for producing a low-capacitance gate pad.

The process for producing the gate pad is shown in FIGS. 8A through 8F. FIG. 8A is a plan view of the gate pad area. An outline of the gate pad 802 is shown on the upper surface of a transistor 801. The upper end of the gate pad 802 is necked-in for connection to the gate pad conductor, such as conductor 107 in FIG. 1. A section line B-B has been drawn through the pad in FIG. 8A where cross sectional views 8B through 8F have been taken.

Figure 8B:
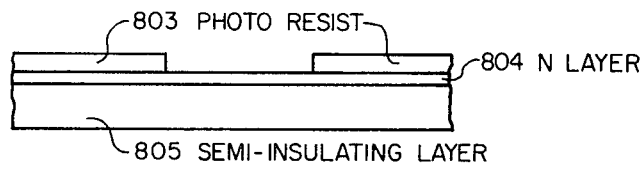

FIG. 8B is a cross section of the transistor, illustrating the initial step in the process for forming the gate pad on the semi-insulating layer. In this step, a coating of photo resist 803, located on the N-layer 804, is exposed and etched to delineate an opening for the gate pad area.

Figure 8C:
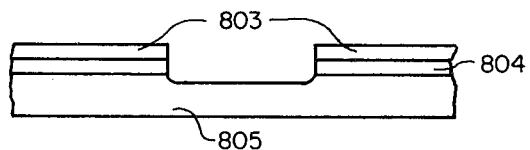

The results of the second step are shown in FIG. 8C. In this step, the N-layer and a small portion of the semi-insulating layer 805 are removed by etching through the photo resist opening over the gate pad area.

Figure 8D:
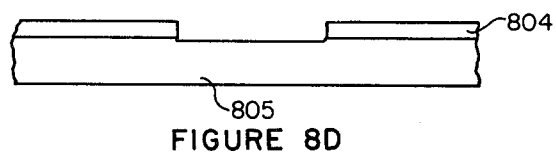

In the third step shown in FIG. 8D, the photo resist 803 is removed by conventional means.

Figure 8E:
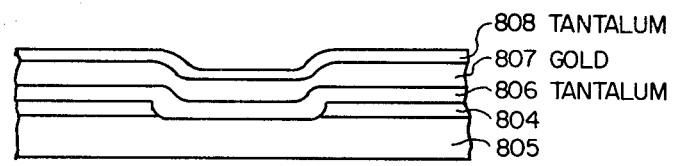

The results of the fourth step are shown in FIG. 8E. In this step, successive layers of tantalum 806, gold 807, and again tantalum 808, are deposited over the gate pad area by such methods as electron-beam technique and RF sputtering, described above in connection with the formation of the gate.

Figure 8F:
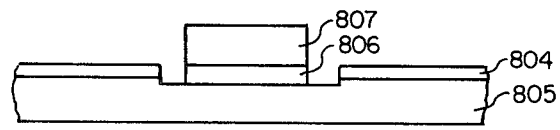

The results of the fifth step are shown in FIG. 8F. In this step, the tantalum layer 808 is completely removed, and the gate pad is completely formed on the semi-insulating layer 805 by masking and sputter-etching.

The gate pad produced by the method shown in FIG. 8 achieves the desired, low, gate capacitance by virtue of its location on the semi-insulating layer. This location, however, is below the surface of the transistor, and, therefore, is surrounded by a rise formed of the N-layer, over which the gate conductor must pass to reach the gate. This presents a problem, because the width of the gate conductor is usually just about the width of the gate. If its cross sectional area is reduced, its resistance is increased accordingly. The portion of the gate conductor which must rise over the N-layer usually receives less material during the deposition process used to form the conductor than the rest of the conductor, making the cross sectional area small at this rise. The difficulty is overcome in this invention by widening the conductor at the rise to compensate for the reduction in deposition thickness.

Figure 9A:
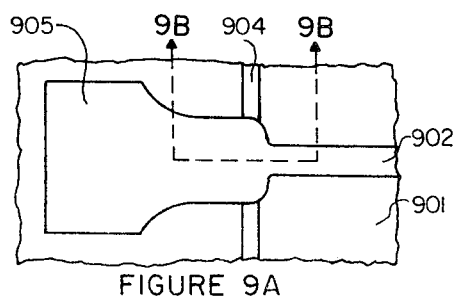
FIG. 9 is a plan view and a cross sectional view, showing the details of the connection to a low-capacitance gate pad.

FIG. 9A is a plan view of a transistor 901 showing the gate pad 905 and the gate pad conductor 902. The portion of the conductor going over the rise 904 can be seen to be wider than the rest of the gate conductor 902.

Figure 9B:
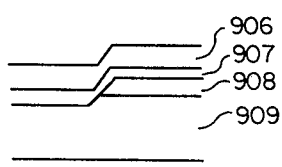

FIG. 9B is a cross sectional view of the rise taken at the section line B-B of FIG. 9A. The transistor cross section shown in FIG. 9B comprises a semi-insulating substrate 909, an N-layer 908, a tantalum layer 907, and a gold layer 906. The need for the compensating widening of the conductor is apparent from the reduction in the cross section of the gold and tantalum layer in the rise, which is clearly evident in FIG. 9B.

Once the gate has been formed, it is possible to proceed to form a complete field-effect transistor. This process is shown in FIG. 10.

Figure 10A:
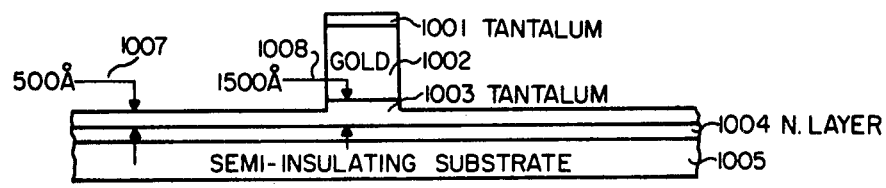
FIG. 10 is a series of cross sectional views illustrating the process for producing a field-effect transistor with tantalum-oxide and native-oxide passivation.

The results of the first step in this process are shown in FIG. 10A. In this step, the gate, comprising a first layer of tantalum 1003, an overlayer of gold 1002, and a second layer of tantalum 1001, is formed on a semiconductor wafer consisting of an N-layer 1004 and a semi-insulating substrate 1005.

The thickness of the tantalum layer 1003 under the gate is nominally 0.15 micron, but over the remaining area it has been etched to only 0.05 micron, as indicated by dimension lines 1008 and 1007, respectively. A practical maximum range of variation for the tantalum thickness in the area designated by dimension 1007 is 200 to 2000 angstroms. The etching process is continued until this range is achieved and the tantalum layer 1001 on top of the gold is completely removed. The layer 1001 is shown in FIG. 10A during the etching process for illustrative purposes.

Figure 10B:
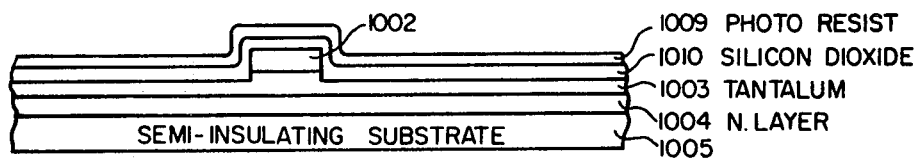

The results of the second step are shown in FIG. 10B. In this step, the entire upper surface of the transistor, including the gate, is covered with successive layers of tantalum 1003, silicon dioxide 1010, and photo resist 1009.

Figure 10C:
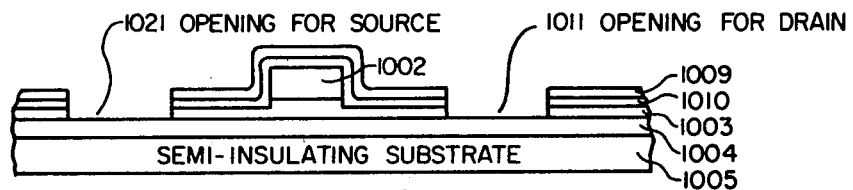

The results of the third step are shown in FIG. 10C. In this step, the photo resist is exposed and etched to produce a first opening 1021 for the source and a second opening 1011 for the drain. The etching is continued in the areas of the openings through the silicon dioxide 1010 and the tantalum 1003 to the N-layer.

Figure 10D:
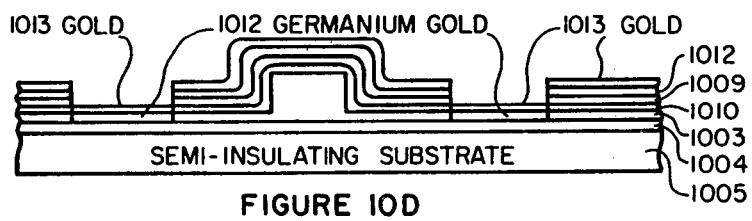

The results of the fourth step are shown in FIG. 10D. In this step, successive layers of germanium gold 1012 and gold 1013 are deposited over the entire upper surface of the transistor to a thickness ranging from 0.05 to 0.1 micron and from 0.3 to 0.5 micron, respectively. The purpose of this deposition is to deposit the germanium gold and the gold on the N-layer in the openings produced in step 3, as a preliminary step in forming the source and the drain. The germanium gold and the gold deposited in other areas are incidental and superfluous to the fabrication of the source and the drain.

Figure 10E:
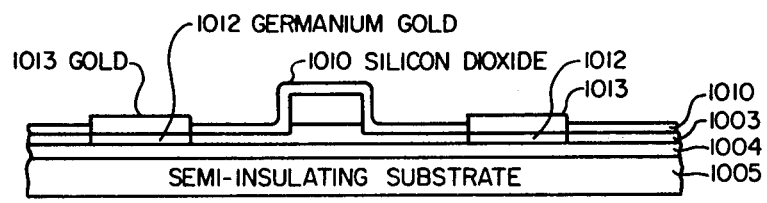

The results of the fifth step are shown in FIG. 10E. In this step, all the superfluous layers of gold and germanium gold above the silicon dioxide are removed by a liftoff technique which includes subjecting the transistor to an acetone bath. The bath dissolves the photo resist under the superfluous layers, causing them to be separated from the transistor. The germanium gold and gold layers which remain in the source and drain areas are then sinter-alloyed to the N-layer to produce ohmic contacts and complete the formation of these electrodes.

Figure 10F:
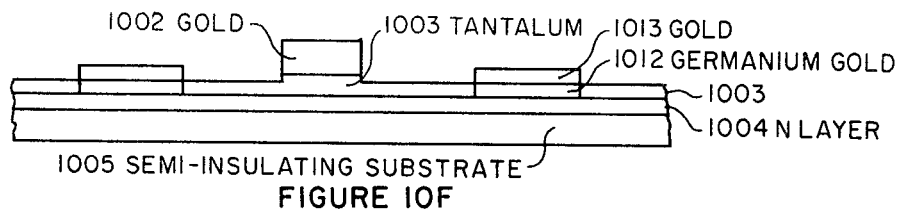

The results of the sixth step are shown in FIG. 10F. In this step, the silicon dioxide layer 1010 is removed everywhere by conventional etching techniques.

Figure 10G:
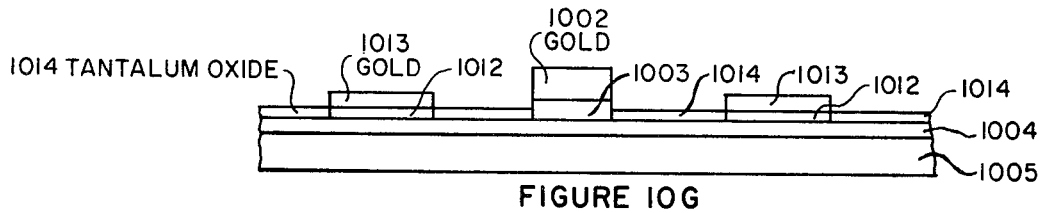

The results of the seventh step are shown in FIG. 10G. In this step, the exposed area of the tantalum layer 1003, away from the source, the gate, and the drain, is oxidized to produce a first protective layer 1014.

Figure 10H:
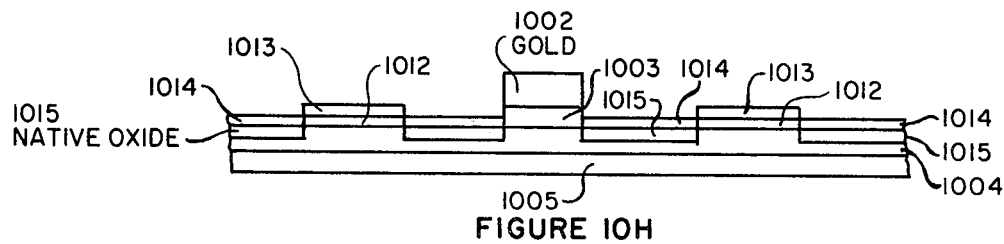

The results of the eighth step are shown in FIG. 10H. In this step, the oxidization process of the seventh step is continued into the surface of the N-layer to produce a passivated layer of native oxide 1015 and thereby provide a second protective layer.

Figure 10I:
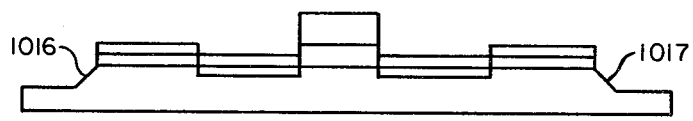

The results of the ninth step are shown in FIG. 10I. In this step, the transistor is coated with photo resist, exposed to define a mesa on the transistor, chemically etched to form the mesa, and then etched to remove the photo resist. The resulting mesa slopes, at the edge of the source and the drain, are identified by numerals 1016 and 1017, respectively.

As can be seen from the fabrication process described above, a tantalum layer 1003 is deposited as one of the earliest fabrication steps. This layer remains throughout the numerous deposition and etching steps in the fabrication process to protect the surface of the N-layer from contamination, thereby reducing leakage and improving the reliability of the transistor.

In one of the later steps in the fabrication process, the tantalum layer can be removed or converted to an oxide by means of anodization, thermal oxidation, or reactive sputtering to provide a protective surface for the transistor. Further oxidation can add a second protective surface, referred to as native oxide, the composition of which is described in greater detail in my U.S. Pat. No. 3,923,975.

The mesa formation is left as the last step, to protect surfaces exposed in this step from contamination by the various processes employed in forming the electrodes.

In step 5 of the process used to produce the source and gate electrodes of the device of FIG. 10, difficulties are usually encountered in completely wetting the gallium arsenide surface with germanium gold during the sinter-alloying step. Prior art processes have employed nickel to act as a wetting agent. At high temperatures, nickel can interact with gallium arsenide. This interaction contributes to catastrophic failures and thus poor device reliability. Without a wetting agent, the germanium gold generally balls up during the sinter alloying step, producing a poorly defined, high resistivity contact.

In a new process for overcoming these problems, a layer of silicon dioxide is applied over the source and drain electrodes to encapsulate the germanium gold and gold used to form these contacts, prior to the sinter alloying step. This new process is illustrated in FIG. 13. The first step is shown in FIG. 13A. In this Figure, a field effect transistor is shown fabricated to the point where the gate has been defined. This device comprises a semi-insulating layer 1305 covered by an N-layer 1304. The gate is formed of a layer of gold 1302 over a layer of tantalum 1303 which is supported by the N-layer 1304. The complete surface of the device is covered with a layer of silicon dioxide 1310 to a depth of approximately 1000 angstroms.

The second step in this process is shown in FIG. 13B. A layer of photo resist 1309 is deposited over the entire upper surface in preparation for defining the source and drain electrodes.

The third step in the process is shown in FIG. 13C. In this step, the photo resist is exposed to define the source and drain electrodes. The photo resist is first removed in the area of the source and drain and then etching is carried out in these areas through the silicon dioxide to produce openings which expose the surface of the N-layer.

The fourth step is shown in FIG. 13D. In this step, germanium gold 1312 and an overlayer of gold 1313 are deposited by sputtering techniques in the openings produced in step three.

The fifth step is shown in FIG. 13E. In this step, the remaining photo resist is removed and the entire upper surface of the device is coated with an additional upper layer of silicon dioxide 1318 to a thickness of approximately 5000 angstroms. Sputtering is used to deposit the silicon dioxide. This layer encapsulates the source and drain electrodes while they are sinter-alloyed to the N-layer. The sinter-alloying process is usually carried out in forming gas or a similar inert ambient at a temperature of about 450° C. for a period of approximately 3 to 8 seconds. During this alloying process, the proper wetting action and elimination of the balling of the germanium gold is accomplished. The result is a high resolution electrode with a low contact resistance. Contact resistivity in the order of $2 \times 10^6$ ohms per centimeter square or less have been achieved.

The sixth step is shown in FIG. 13F. In this step, the top layer of silicon dioxide 1318 is removed by etching. The gold and germanium gold layers have been converted to a single layer designated by numeral 1319.

The seventh step is shown in FIG. 13G. In this step, a layer of photo resist 1320 is deposited over the entire upper surface of the device. The photo resist is then exposed to define a mesa. The photo resist is then removed in the areas in which the mesa is to be etched.

In the eighth step, shown in FIG. 13H, the mesa is etched and the remaining photo resist is removed. Further etching is carried out to remove or to reduce the thickness of the silicon dioxide layer 1310. The resultant structure shown in 13H is a completed device offering superior definition of the source and drain electrodes and higher reliability.

In an alternative process, step 4 is changed by depositing a layer of germanium gold only. The sixth step is changed to include depositing a layer of tantalum, tungsten or molybdenum with an overlayer of gold over the germanium gold ohmic contact.

Figure 11:
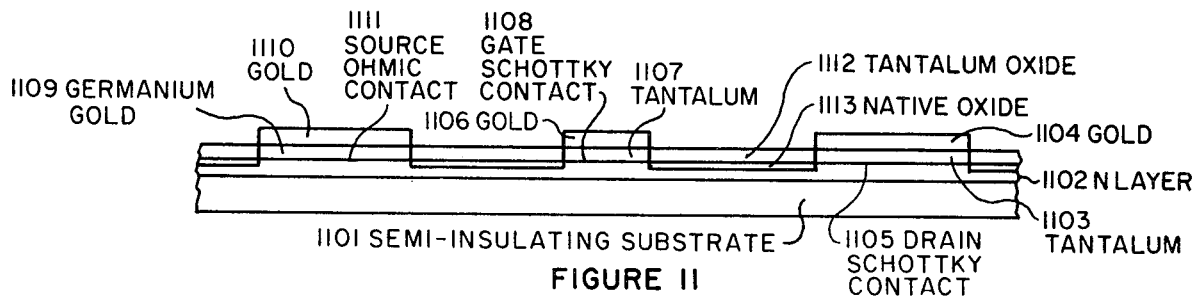
FIG. 11 is a cross sectional view of a field-effect transistor containing a Schottky junction at the gate and at the drain.

A new field-effect transistor configuration is shown in FIG. 11. In the usual configuration, illustrated in FIG. 10, the source and drain are ohmic contacts, but in the transistor shown in FIG. 11, only the source is an ohmic contact, while the gate and the drain are Schottky junctions.

The transistor of FIG. 11 comprises a semi-insulating substrate 1101, an N-layer 1102, a tantalum layer 1103 over the drain area, a gold layer 1104 over the tantalum layer 1103, a native oxide layer 1113 between the electrodes, a tantalum oxide layer 1112 over the native oxide layer, a tantalum layer 1107 over the gate area, a gold layer 1106 over the tantalum layer 1107, a germanium gold layer 1109 over the source area, and a gold layer 1110 over the germanium gold layer 1109. The gate and drain metalizations form Schottky contacts 1108 and 1105 respectively with the N-layer 1102, while the source metalization forms an ohmic contact with the N-layer 1102.

In this transistor, the N-layer has a carrier concentration ranging from $1 \times 10^{16}$ to $4 \times 10^{18}$ atoms per cubic centimeter. The thickness of the germanium gold ranges from 0.05 to 0.1 micron, and the thickness of the gold ranges from 0.3 to 1.5 microns.

The process for producing this transistor is similar to that described in connection with the transistor of FIG. 10, except the gate and drain may be formed at the same time, using the same mask. This eliminates registration difficulties associated with the critical distance between these two electrodes. In addition, tantalum, which has proven to be an excellent diffusion barrier for gold, has been applied as the contacting layer 1103 in the drain beneath the gold overlayer. The use of tantalum as a gold diffusion barrier is described in more detail in my U.S. Pat. No. 3,886,580.

In the operation of this device, there is no change in the biasing over that applied to a conventional field-effect transistor. With this usual biasing arrangement, the drain junction operates in the forward-biased region.

Figure 12:
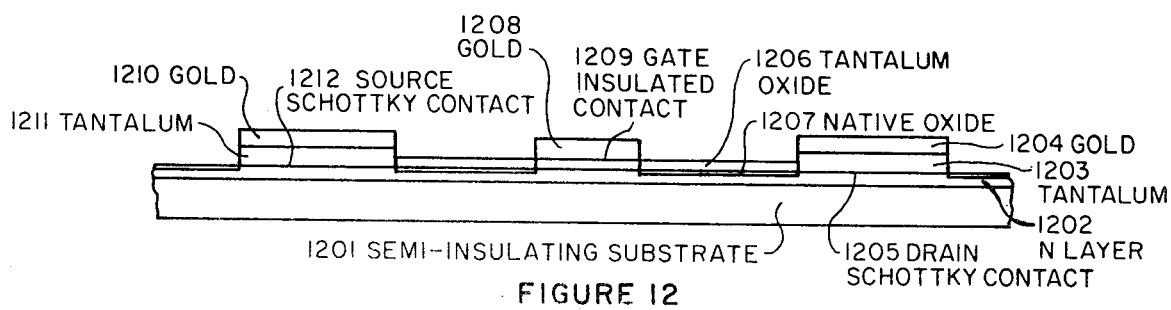
FIG. 12 is a cross sectional view of a metal-oxide-insulated-gate field-effect transistor.

A new type of metal oxide field-effect transistor incorporating an insulated gate is shown in FIG. 12. In this device, Schottky junctions are substituted for diffusion junctions, and an oxidized layer of tantalum forms the insulating layer under the gate as well as a protective layer away from the gate.

This transistor may be produced at low temperatures, which increases yield and reliability because no sinter-alloying is necessary to produce ohmic contacts. This transistor comprises a semi-insulating substrate 1201, an N-layer 1202 with a carrier concentration in the range of $1 \times 10^{16}$ to $4 \times 10^{18}$ atoms per cubic centimeter, a drain contacting layer of tantalum 1203, a drain overlayer of gold 1204 a drain Schottky contact 1205, a layer of native oxide 1207 between the contacts formed on the N-layer 1202, a gate insulating layer of tantalum oxide 1206, a gate overlayer of gold 1208 a gate insulating contact 1209, a source contacting layer of tantalum 1211 a source Schottky contact 1212, and a source overlayer of gold 1210. It should be noted than an equivalent alternative gate structure comprises a tantalum layer with a gold overlayer. The source and drain tantalum contacting layer thickness ranges from 0.1 to 0.2 micron, while the tantalum oxide layer 1206 ranges from 0.02 to 0.1 micron. Note the oxide layer 1206 continues beyond the gate to the source and drain.

In conventional insulated transistors, the junctions are formed by diffusion. It is difficult to control the lateral diffusion and, therefore, the critical dimensions between the gate and the source, and the gate and the drain are not always well controlled in conventional transistors. In the present invention, however, the diffused junctions are replaced by Schottky junctions, there is no lateral diffusion, and the critical dimensions are well controlled.

There is a difference in the biasing between conventional field-effect transistors and the transistor shown in FIG. 12. To turn the present invention "on", a negative voltage is applied to the gate rather than the positive voltage used with conventional P-channel diffused-junction devices.

Having described my invention, I claim:

1. A process for fabricating a field-effect transistor of the type having a source, a gate, and a drain, comprising the steps of:
   (a) providing a semi-insulating semiconductor substrate with an N-layer, said N-layer having a carrier concentration ranging from $1 \times 10^{16}$ to $4 \times 10^{18}$ atoms per cubic centimeter,
   (b) depositing a first layer of tantalum on said N-doped layer,
   (c) depositing a layer of gold on said first layer of tantalum,
   (d) depositing a second layer of tantalum on the gold, approximately equal in thickness to said first layer of tantalum,
   (e) depositing a layer of photo resist material over the second layer of tantalum,
   (f) defining the areas of the gate and the drain in the photo resist material by photolithographic means,
   (g) removing the second tantalum layer except for the area of the gate and the drain,
   (h) removing the photo resist over the gate and drain, (i) removing the gold not protected by the remaining second tantalum layer over the gate and drain areas, (j) removing the first tantalum not protected by the remaining gold over the gate and drain areas, (k) removing the remaining second tantalum layer simultaneously with the removal of the first tantalum layer in step (j), and (l) forming an ohmic contact to the N-layer to provide the source electrode.

2. A process as claimed in claim 1, wherein said source ohmic contact is formed by the steps of:

(a) cleaning the surface of the device, (b) depositing a first film of silicon dioxide over the surface of the device, (c) depositing a film of photo resist over the silicon dioxide, (d) defining the source area by photolithographic means, (e) removing the photo resist and the silicon dioxide in the area of the source, (f) depositing a layer of germanium gold, (g) depositing a layer of gold on the germanium gold layer, (h) removing the remaining photo resist, germanium gold, and gold outside the area of the source, (i) depositing a second film of silicon dioxide over the surface of the ohmic contact and its periphery, (j) sinter-alloying the germanium gold and gold to the N-layer in the source area to form an ohmic contact, and (k) removing the second film of silicon dioxide.

3. A process as claimed in claim 2, wherein the deposition of germanium gold is to a thickness ranging from 0.05 to 0.1 micron and the deposition of the gold is to a thickness ranging from 0.3 to 0.5 micron.

* * * * *